(12) United States Patent
Azar et al.

(10) Patent No.: US 11,653,478 B1
(45) Date of Patent: May 16, 2023

(54) STACKABLE ENCLOSURE SYSTEM WITH COOLING FEATURES, AND RELATED APPARATUS AND METHODS

(71) Applicant: Advanced Thermal Solutions, Inc., Norwood, MA (US)

(72) Inventors: Kaveh Azar, Quincy, MA (US); Geng Qian, Sharon, MA (US); Anatoly Pikovsky, Sharon, MA (US)

(73) Assignee: Advanced Thermal Solutions, Inc., Norwood, MA (US)

( * ) Notice: Subject to any disclaimer, the term of this patent is extended or adjusted under 35 U.S.C. 154(b) by 0 days.

(21) Appl. No.: 17/233,995

(22) Filed: Apr. 19, 2021

(51) Int. Cl.
*H05K 7/20* (2006.01)

(52) U.S. Cl.
CPC ............... *H05K 7/20727* (2013.01)

(58) Field of Classification Search
CPC ................................................ H05K 7/20727
See application file for complete search history.

(56) References Cited

U.S. PATENT DOCUMENTS

| | | | |
|---|---|---|---|
| 9,398,727 B2* | 7/2016 | Liu ................... | H05K 7/20727 |
| 2009/0059520 A1* | 3/2009 | Tanaka ................ | G11B 33/142 |
| | | | 361/692 |
| 2009/0135558 A1* | 5/2009 | Hughes .............. | H05K 7/20727 |
| | | | 361/679.46 |

* cited by examiner

*Primary Examiner* — Mukundbhai G Patel
(74) *Attorney, Agent, or Firm* — Lieberman & Brandsdorfer, LLC

(57) ABSTRACT

Embodiments relate to a system, an apparatus, and a method that involve a plurality of stackable enclosure units that include inter-unit or inter-module passages for facilitating cooling of interior compartments of the units, especially server units.

21 Claims, 14 Drawing Sheets

STACKABLE ENCLOSURE SYSTEM WITH COOLING FEATURES, AND RELATED APPARATUS AND METHODS

BACKGROUND

The present embodiments relate to a system of stackable enclosure units, especially but not limited to stackable electronics enclosure units, including a cooling feature operable as, for example, a rack server apparatus, a tower server apparatus, or a blade server apparatus. The present embodiments further relate to apparatus including the system of stackable (electronics) enclosure units, and methods of making and using the system.

Artificial intelligence and other sophisticated computing typically require the use of servers equipped with powerful processors and other electronic components. As the quantity and power of those processors and electronic components have increased over time, so has the amount of generated heat byproduct. Heat byproduct removal is critical for avoiding interruption or thermal breakdown of the servers. One solution has been to locate and operate the servers in relatively low temperature rooms or environments. However, this solution may be less than optimal if the low temperature gas (typically air) does not flow into the casings of the servers or equipment housing.

SUMMARY

The embodiments include stackable electronics (e.g., server) enclosure units with cooling systems, apparatus including the server units, and methods of making and using the same.

In one aspect, a system is provided that includes a first enclosure unit, a second enclosure unit, an electronic component, and one or more gas movers. The first enclosure unit includes a first casing. The first casing has first and second walls spaced from one another and a first compartment within the first casing between the first and second walls. The first wall includes a first inlet. The second enclosure unit includes a second casing that is stackable with respect to the first casing. The second casing includes third and fourth walls spaced from one another and a second compartment within the second casing between the third and fourth walls. The third wall has a first outlet that, when the first and second casings are stacked with respect to one another with the first outlet and the first inlet aligned with one another, fluidly communicates with the first and second compartments with one another. The electronic component is operable to generate heat byproduct and is received in the first compartment of the first enclosure unit or the second compartment of the second enclosure unit. The one or more gas movers are at least partially received in the first compartment, the second compartment, or the first and second compartments. The one or more gas movers are configured, when the first and second casing are stacked with respect to one another with the first outlet and the first inlet aligned, to receive gas through the aligned first inlet and first outlet and to expel the received gas through at least one exhaust vent of the system.

In another aspect an apparatus is provided that includes a rack and a system receivable in the rack. The system includes a first enclosure unit, a second enclosure unit, an electronic component, and one or more gas movers. The first enclosure unit includes a first casing having first and second walls spaced from one another and a first compartment within the first casing between the first and second walls. The first wall has a first inlet. The second enclosure unit includes a second casing that is stacked with respect to the first casing. The second casing includes third and fourth walls spaced from one another and a second compartment within the second casing between the third and fourth walls. The electronic component is operable to generate heat byproduct and is received in the first compartment of the first enclosure unit or the second compartment of the second enclosure unit. The third wall includes a first outlet that fluidly communicates the first and second compartments with one another. The one or more gas movers are at least partially received in the first compartment, the second compartment, or the first and second compartments. The one or more gas movers are configured to receive gas through the aligned first inlet and first outlet and to expel the received gas through at least one exhaust vent of the system.

In yet another aspect, a method is provided in which a system including a first enclosure unit, a second enclosure unit, an electronic component, and one or more gas movers. The first enclosure unit includes a first casing having first and second walls spaced from one another and a first compartment within the first casing between the first and second walls. The first wall has a first inlet. The second enclosure unit includes a second casing that is stacked with respect to the first casing. The second casing includes third and fourth walls spaced from one another and a second compartment within the second casing between the third and fourth walls. The electronic component is operable to generate heat byproduct and is received in the first compartment of the first enclosure unit or the second compartment of the second enclosure unit. The third wall includes a first outlet that fluidly communicates with the first inlet to communicate the first and second compartments with one another. The one or more gas movers are operated to receive gas from the second compartment through the fluidly communicating first outlet and first inlet and to expel the gas from the second compartment through the exhaust vent of the system.

These and other features and advantages will become apparent from the following detailed description of the exemplary embodiment(s), taken in conjunction with the accompanying drawings.

BRIEF DESCRIPTION OF THE SEVERAL VIEWS OF THE DRAWINGS

The drawings reference herein form part of the specification are incorporated herein in their entirety. Features shown in the drawings are meant as illustrative of only some embodiments, and not of all embodiments, unless otherwise explicitly indicated.

DETAILED DESCRIPTION

It will be readily understood that the components and features of the exemplary embodiments, as generally described and illustrated in the Figures herein, may be arranged and designed in a wide variety of different configurations. Thus, the following detailed description of the exemplary embodiments, as presented in the Figures, is not intended to limit the scope of the embodiments, as claimed, but is merely representative of selected embodiments.

Reference throughout this specification to "a select embodiment," "one embodiment," or "an embodiment" means that a particular feature, structure, or characteristic described in connection with the embodiment is included in at least one embodiment. Thus, appearances of the phrases "a select embodiment," "in one embodiment," or "in an embodiment" in various places throughout this specification are not necessarily referring to the same embodiment. The various embodiments described herein may be combined with one another, and features (or omissions) of embodiments may be incorporated into other embodiments.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

Figure 1:
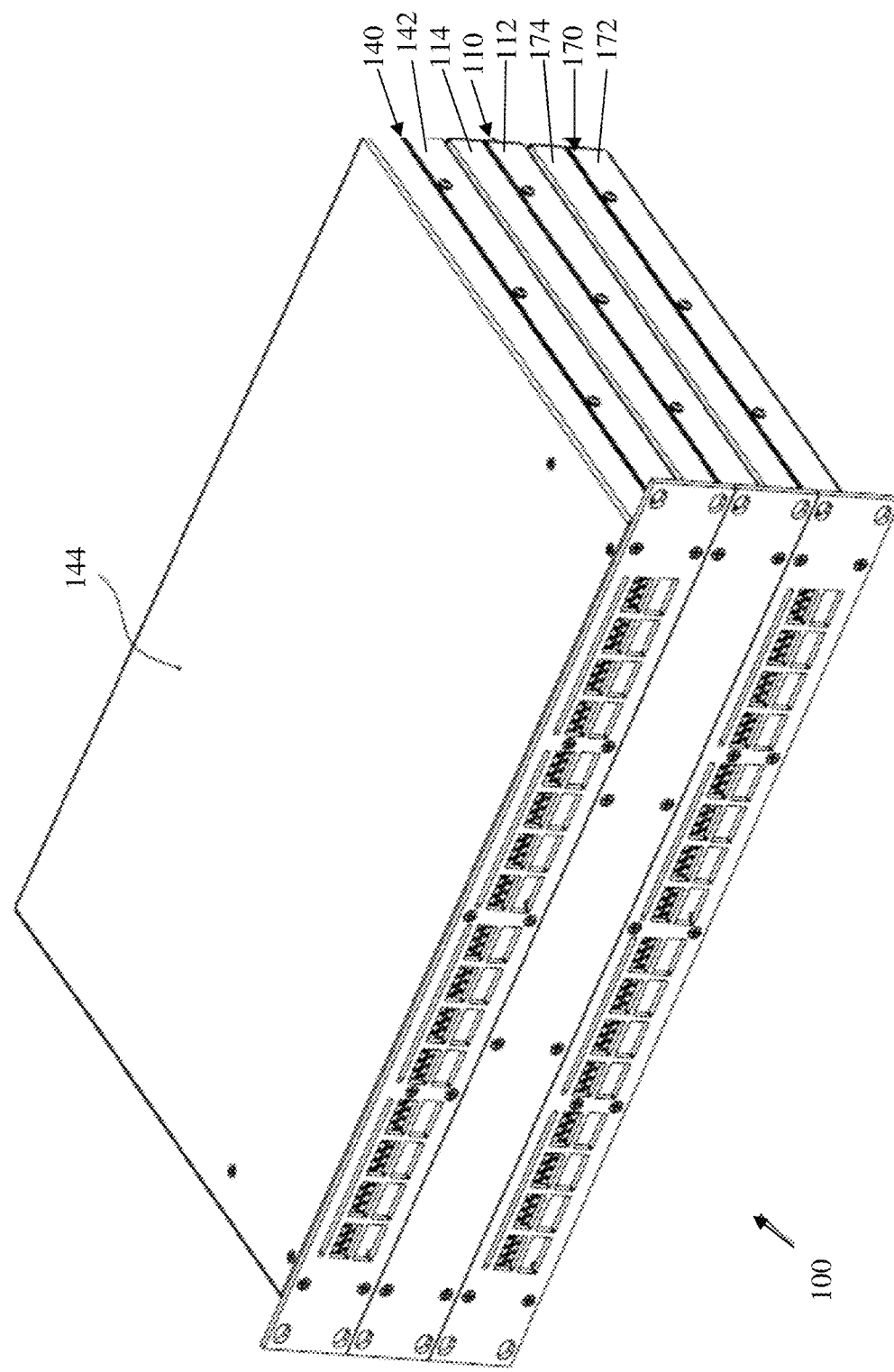
FIG. 1 depicts a top perspective view of a system including a plurality of enclosure units in stacked arrangement.

Referring now more particularly to FIG. 1, a system according to an embodiment is generally represented by reference numeral (100). The system (100) includes a first enclosure unit, which is also referred to as a first module and embodied as a cooling circulation unit (110), a second enclosure unit (140), which is also referred to as a second module and embodied as a first server unit, and a third enclosure unit (170), which is also referred to as a third module and embodied as a second server unit in the drawings. The first enclosure unit (110) is positioned between the second enclosure unit (140) and the third enclosure unit (170). That is, the first enclosure unit (110) is stacked proximal to or on the third enclosure unit (170), and the second enclosure unit (140) is stacked proximal to or on the first enclosure unit (110). The designations "first," "second," "third," etc. are provided herein for the purpose of identification, and are not intended to denote a sequence or order of importance. Further, the designations "first," "second," "third," etc. included in the specification for identification of parts of the drawings do not necessarily conform to the designations in the claims, which are not limited to the embodiments shown in the drawings.

Although the system (100) is embodied throughout FIGS. 1 through 13 and the systems (300) and (500) are embodied below with respect to FIGS. 14 and 15, respectively, as including three enclosure units or modules (110), (140), and (170), it should be understood that the system(s) (100), (300), and (500) may include additional or fewer enclosure units or modules. For example and without limitation, a fourth enclosure unit or module (not shown) may be located above the second enclosure unit (140) and/or a fifth enclosure unit or module (not shown) may be located below the third enclosure unit (170).

The first enclosure unit (110) includes a first tray (112) and a first cover (114) removably attached to the first tray (112). The first tray (112) and the first cover (114) collectively establish a casing of the first enclosure unit (110). Similarly, the second enclosure unit (140) includes a second tray (142) removably attached to a second cover (144), and the third enclosure unit (170) includes a third tray (172) removably attached to a third cover (174). The second tray (142) and the second cover (144) collectively establish a casing of the second enclosure unit (140). The third tray (172) and the third cover (174) collectively establish a casing of the third enclosure unit (170). The components of the first enclosure unit (110), the second enclosure unit (140), and the third enclosure unit (170) can be made of any suitable material or material(s), although metal (e.g., aluminum) is particularly useful in various exemplary embodiments.

The components of the first tray (112) (and the other trays described herein) can be connected using, for example, mechanical fasteners (e.g., screws, bolts, clips, etc.) and/or adhesives. Alternatively the components of the first tray (112) (and the other trays described herein) can be integrally formed or welded together. Similarly, mechanical fasteners (e.g., screws, bolts, clips, etc.) can be used for removably attaching the first cover (114), the second cover (144), and the third cover (174) to the first tray (112), the second tray (142), and the third tray (172), respectively. Alternatively, the first cover (114), the second cover (144), and the third cover (174) may be non-removably attached to the first tray (112), the second tray (142), and the third tray (172), respectively, using, for example, adhesives or welding. Where shown in the drawings, the mechanical fasteners are unnumbered. It should be understood that additional or fewer mechanical fasteners than shown may be used. It should further be understood that mechanical fasteners may be positioned in locations other than shown in the drawings.

Figure 2:
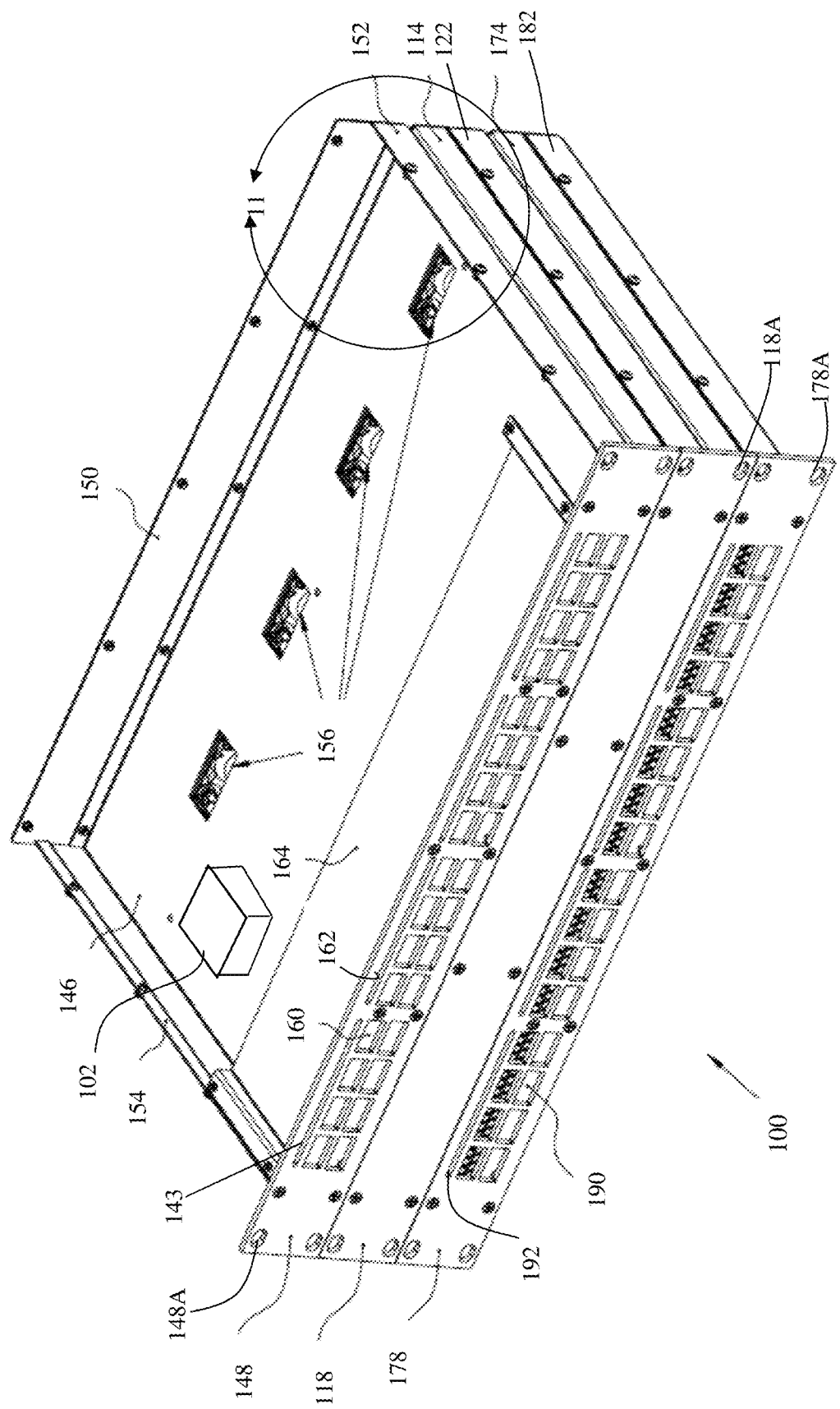
FIG. 2 depicts a top perspective view of the system of FIG. 1, with a cover of a top enclosure unit of the system removed for explanatory purposes.

One or more of the enclosure units (110), (140), and/or (170) include hardware computing or electronic components, such as electronic component (102) shown in FIG. 2 within the casing of enclosure unit (140). In an embodiment, one or more of the enclosure units (110), (140), and/or (170), include a plurality of, for example, central processing units (CPUs) and system controllers (SCs), and/or slots receiving the same. Each CPU is associated with one or more CPU cores (or cores), such as a six-core processor or eight-core processor. In an exemplary embodiment, the second enclosure unit (140) and the third enclosure unit (170) are configured as servers with one or more CPUs and/or one or more SCs that generate heat byproduct. In order to remove heat from the system (100), and in particular the second and third enclosure units (140) and (170), respectively, the first enclosure unit (110), or a portion thereof, serves as a gas (e.g., air) circulation unit. In an exemplary embodiment, the first enclosure unit (110) does not contain CPUs and/or SC. Alternatively, the first enclosure unit (110) may serve as both a gas (e.g., air) circulation unit and a server containing one or more CPUs and one or more SCs. The first, second, and third enclosure unit (110), (140), and (170), respectively, may operate independently of one another, e.g., with the computing hardware necessary for carrying out the desired operability contained in a single enclosure unit (e.g., the second enclosure unit (140) or the third enclosure unit (170)). Alternatively, the first, second, and third enclosure units (110), (140), and (170), respectively, may be interrelated to operate in conjunction with one another, e.g., with the computing hardware necessary for carrying out a desired functionality distributed among the modules of the system (100) (e.g., in the second enclosure unit (140) and the third enclosure unit (170)).

Figure 5:
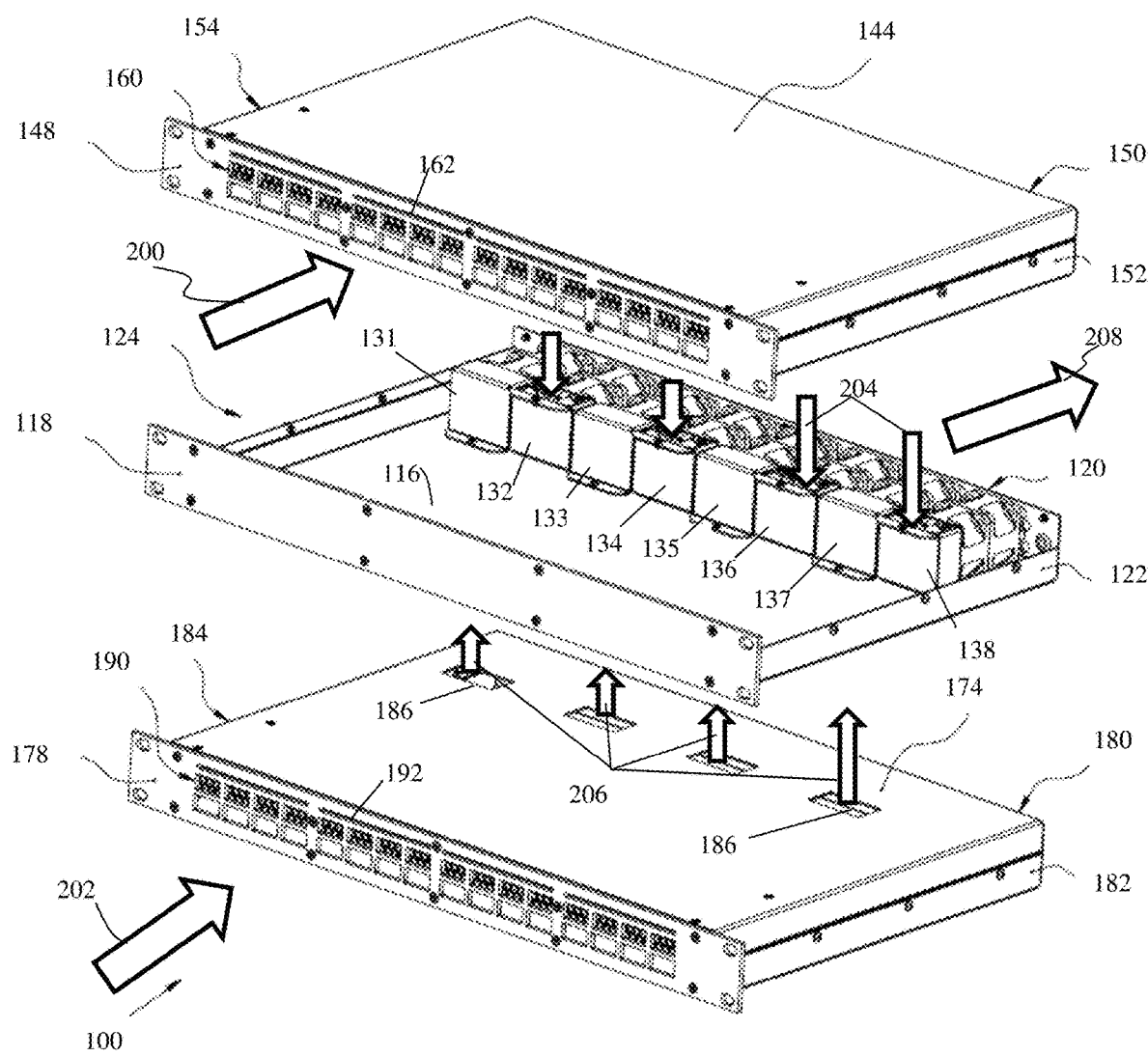
FIG. 5 depicts a top perspective, exploded view of the system of FIG. 1, with a cover of a middle enclosure unit removed, and with arrows representing the direction of gas (e.g., air) flow into, through, and from the stacked enclosure units of the system.

The first tray (112) and the first cover (114) collectively define or establish a first compartment or chamber. In FIG. 5, the first enclosure unit (110) is illustrated with its cover (114) (FIG. 1) removed and not shown for explanatory purposes. The first tray (112) includes a first lower wall (or bottom) (116) parallel or substantially parallel to and spaced from the first cover (114), a first front wall (118) that is perpendicular or substantially perpendicular to the first lower wall (116), a rear first wall (120) that is parallel or substantially parallel to and spaced from the first front wall (118), a first proximal end wall (122), and a first distal end wall (124) that is parallel or substantially parallel to and spaced from the first proximal end wall (122). The first proximal end wall (122) and the first distal end wall (124) are perpendicular or relatively perpendicular to the first lower wall (116), the first front wall (118), and the first rear wall (120).

Figure 3:
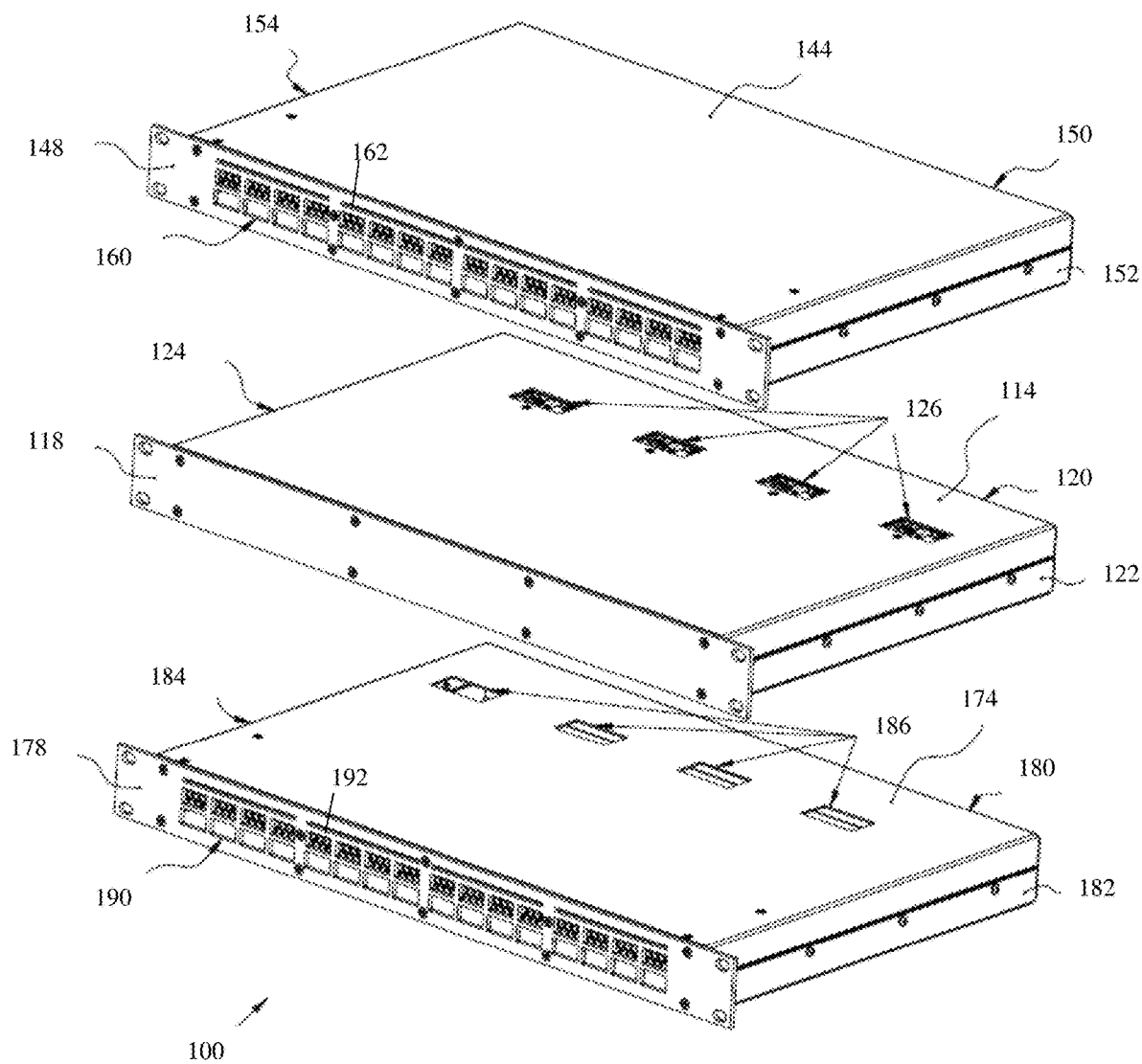
FIG. 3 depicts a top perspective, exploded view of the system of FIG. 1.
Figure 4:
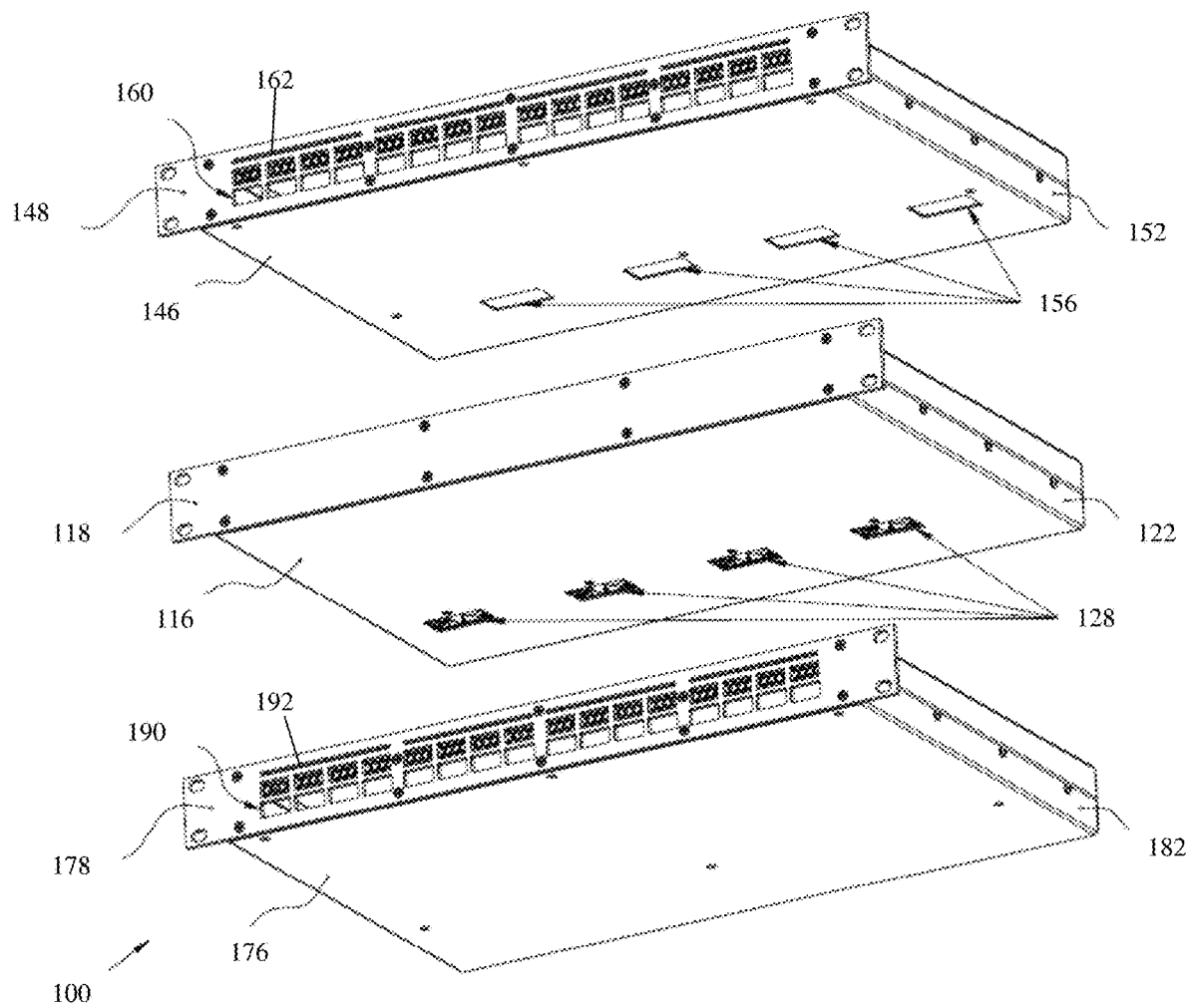
FIG. 4 depicts a bottom perspective, exploded view of the system of FIG. 1.
Figure 6:
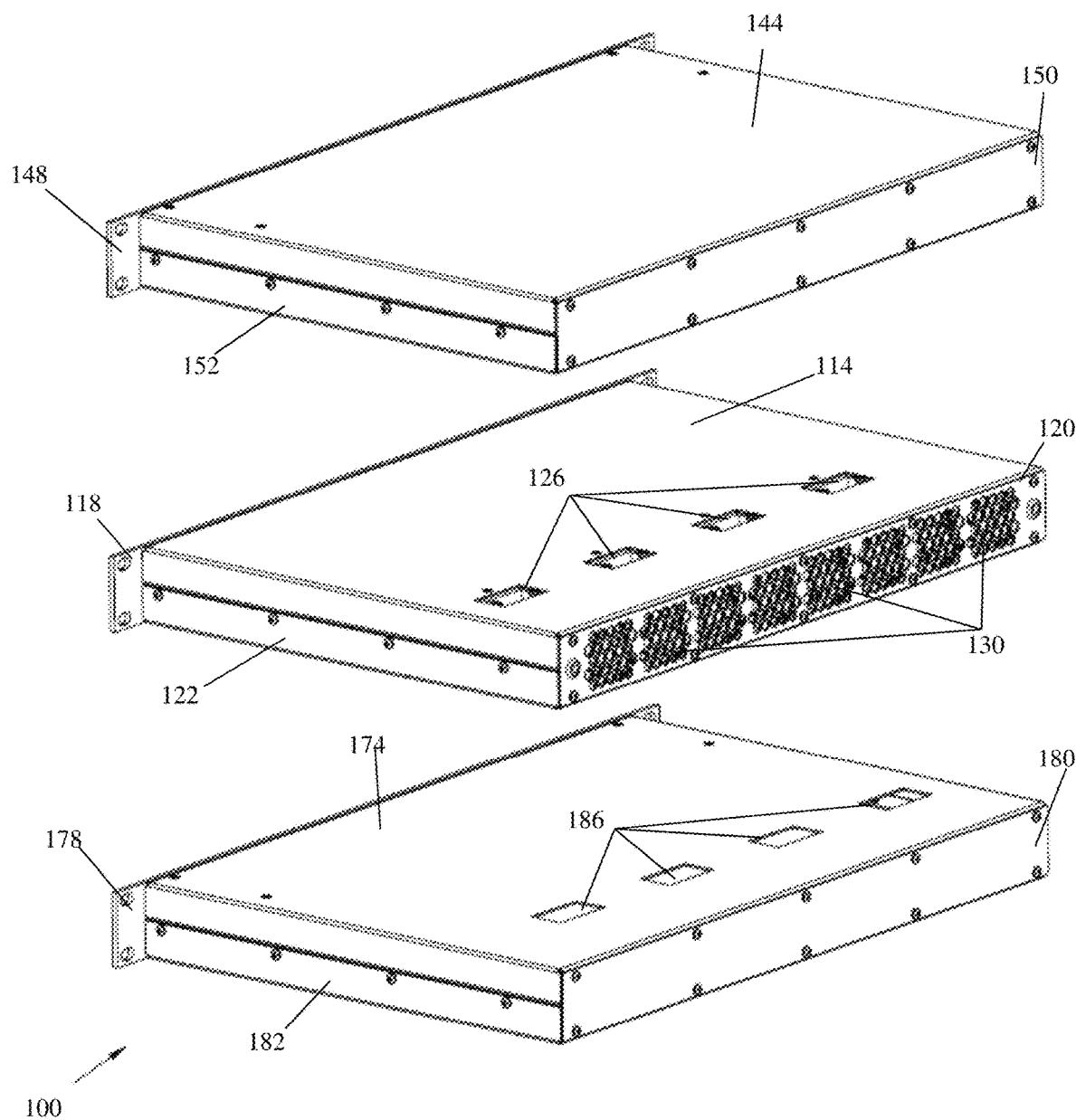
FIG. 6 depicts a rear perspective, exploded view of the system of FIG. 1.

As best shown in FIGS. 3 and 6, a top wall of the first cover (114) includes a plurality of upper inlets (also referred to herein as upper inflow ports) (126) extending through the top of the cover (114). As best shown in FIG. 4, the first lower wall (116) of the first tray (112) includes a plurality of lower inlets (also referred to herein as lower inflow ports) (128). Although four upper inlets (126) and four lower inlets (128) are shown in FIGS. 3, 4, and 6, it should be understood that the first enclosure unit (110) may include fewer or more upper inlets (126) than shown, and that the first enclosure unit (110) may include fewer or more lower inlets (128) than shown. In an exemplary embodiment, the quantity of the upper inlets (126) equals the quantity of the lower inlets (128), although the quantities may differ. In an exemplary embodiment, the positioning of the upper inlets (126) is staggered with respect to the positioning of the lower inlets (128). The various inlets and outlets described herein can be formed by any suitable method, including in-situ formation while preparing the associated component, stamping, cutting, etc.

Referring to FIG. 5, the first enclosure unit (110) includes first, second, third, fourth, fifth, sixth, seventh, and eighth cells (131), (132), (133), (134), (135), (136), (137), and (138), respectively, arranged co-linear with one another. The first cell (131), the third cell (133), the fifth cell (135), and the seventh cell (137) are each arranged above and communicate with a corresponding one of the four lower inlets (128) (but not the four upper inlets (126)). The second cell (132), the fourth cell (134), the sixth cell (136), and the eighth cell (138) are each arranged below and communicate with a corresponding one of the fourth upper inlets (126) (but not the four lower inlets (128)). The first cell (131), the third cell (133), the fifth cell (135), and the seventh cell (137) alternate with respect to the second cell (132), the fourth cell (134), the sixth cell (136), and the eighth cell (138).

Figure 7:
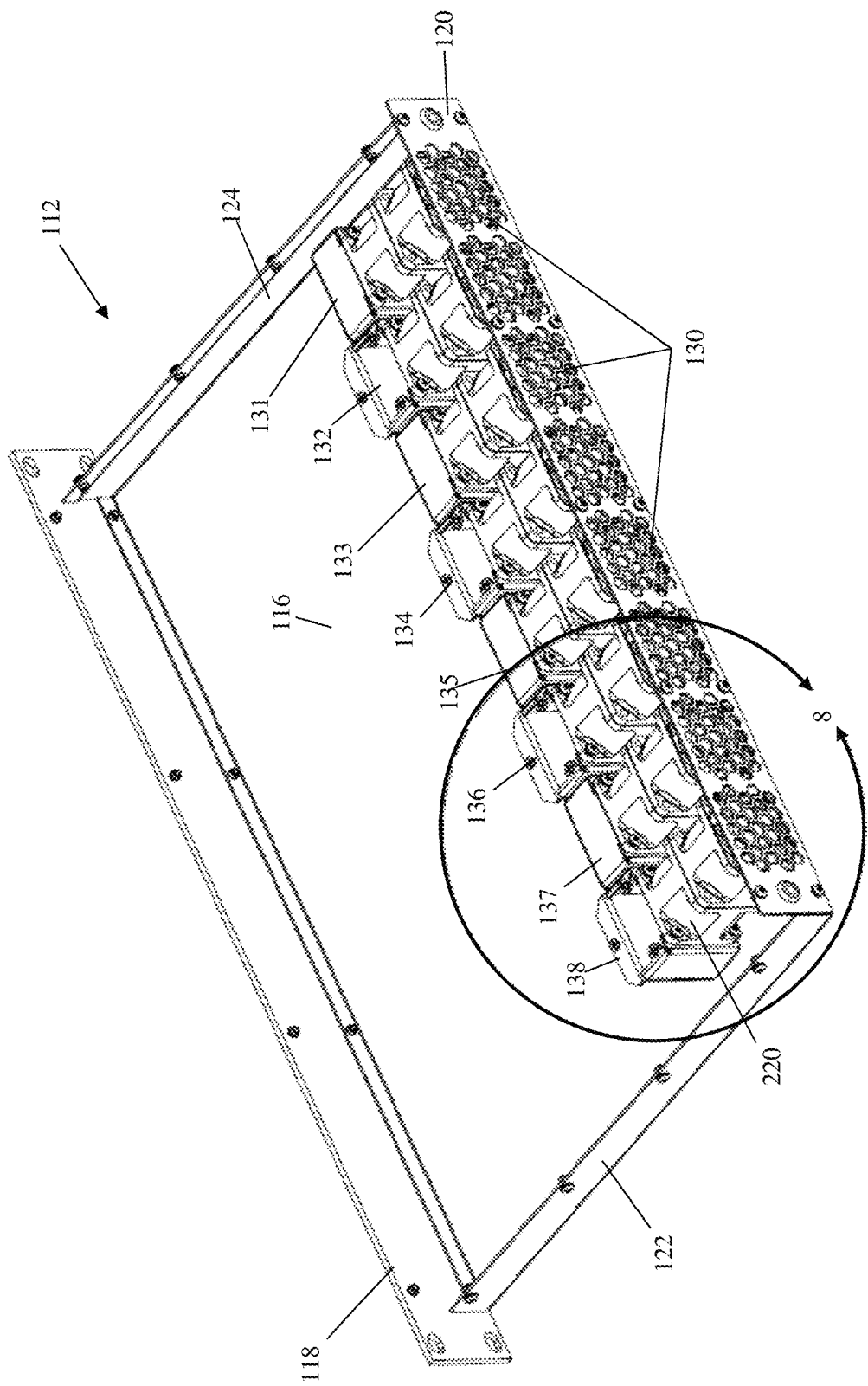
FIG. 7 depicts a rear perspective view of the middle enclosure unit of the system of FIG. 1, with the cover of the middle enclosure unit removed.
Figure 8:
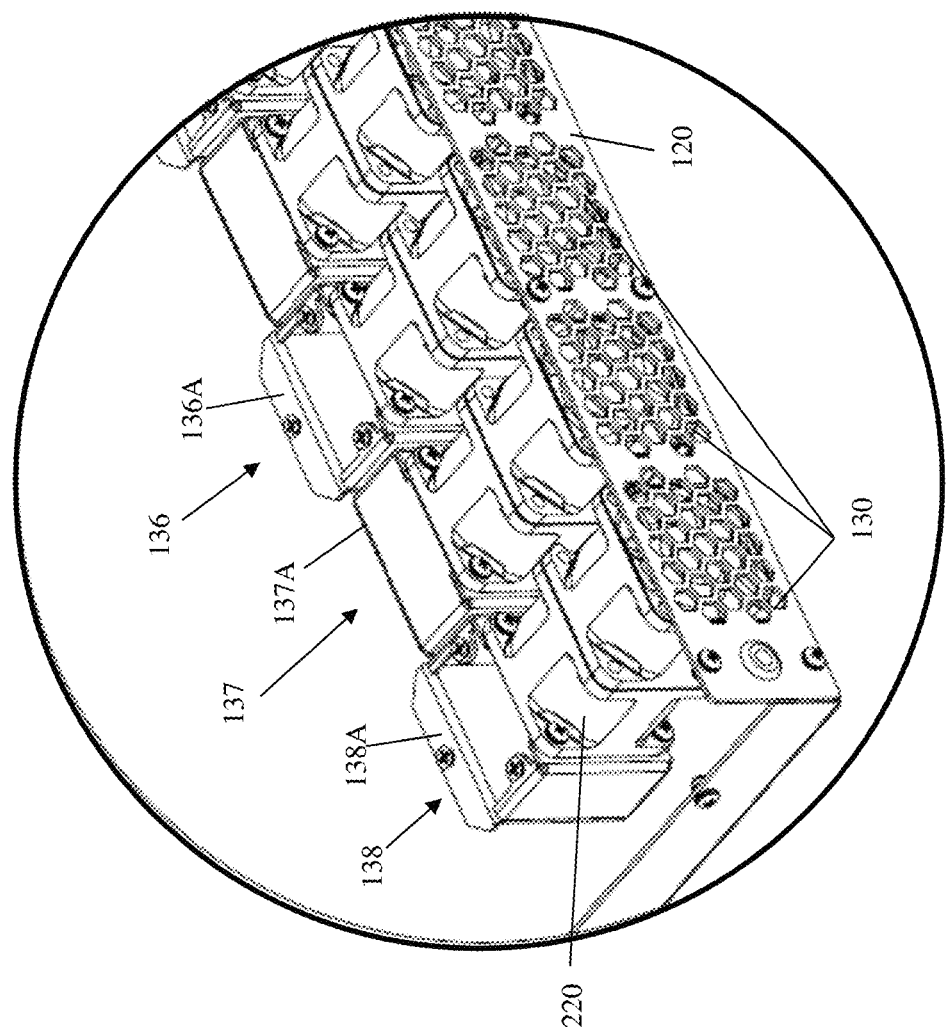
FIG. 8 depicts an enlarged view of the area enclosed by circle 8 of FIG. 7.

As best shown in FIGS. 6-8, the first rear wall (120) of the first tray (112) includes openings (130), also referred to herein as exhaust vents or vent openings, communicating with the cells (131)-(138). The exhaust vents (130) are configured as hexagonal shaped openings, although it should be understood that the exhaust vents (130) may possess other configurations, arrangements, and quantities. The first front wall (118) of the first tray (112) does not include vents or openings, although the presence of vents or openings in the first front wall (118) is not prohibited.

As best shown in FIGS. 1 and 2, the second enclosure unit (140) includes the second tray (142) and the second cover (144), which is omitted from FIG. 2. The second tray (142) and the second cover (144) collectively define or establish a second compartment or chamber.

The second tray (142) includes a second lower wall (or bottom) (146) parallel to and spaced from a top wall of the second cover (144), a second front wall (148) that is perpendicular or substantially perpendicular to the second lower wall (146), a second rear wall (150) that is parallel or relatively parallel to and spaced from the second front wall (148), a second proximal end wall (152), and a second distal end wall (154) that is parallel or substantially parallel to and spaced from the second proximal end wall (152). The second proximal end wall (152) and the second distal end wall (154) are perpendicular or substantially perpendicular to the second lower wall (146), the second front wall (148), and the second rear wall (150).

As best shown in FIGS. 2 and 4, the second lower wall (146) includes a plurality of lower outlets (also referred to herein as outflow ports) (156). Each of the lower outlets (156) is aligned with and communicates with a corresponding one of the upper inlets (126) of the first enclosure unit (110) to provide inter-unit or inter-module interconnected passages. Although four lower outlets (156) are shown in FIGS. 2 and 4, it should be understood that the second lower wall (146) may include fewer or more lower outlets (156). In an exemplary embodiment, the quantity of the lower outlets (156) equals the quantity of the upper inlets (126).

The second front wall (148) includes inflow vent openings (160) and inflow vent slots (162) that are in communication with the second compartment for receiving a gas, such as air, through the inflow vent openings (160) and the inflow vent slots (162) and into the second compartment. Although the inflow vent openings (160) are illustrated having rectangular configurations and grouped into sets of eight, it should be understood that the vent openings (160) may be provided in alternative configurations, arrangements, and quantities. Similarly, although the inflow vent slots (162) are shown collinear with one another and in a quantity of four, it should be understood that the inflow vent slots (162) may be provided in alternative (e.g., non-slot shaped) configurations, arrangements, and quantities. Further, the inflow vent openings (160) and/or the inflow vent slots (162) may be provided on other walls of the second enclosure unit (140), in addition to or instead of in the second front wall (148).

FIG. 2 illustrates a baffle (164) securely fastened within the chamber of the second enclosure unit (140) to separate the inflow of gas, typically air, through the inflow vent openings (160) below the baffle (164) and the inflow vent slots (162) above the baffle (164). The second rear wall (150) does not include vents or openings, although the presence of vents or openings in the second rear wall (150) or other walls of the second enclosure unit (140) is not prohibited unless so specified.

The third enclosure unit (170) includes the third tray (172) and the third cover (174). The third tray (172) and the third cover (174) collectively define or establish a third compartment or chamber of the third enclosure unit (170).

The third tray (172) includes a third lower wall (or bottom) (176) parallel or substantially parallel to and spaced from a top wall of the third cover (174), a third front wall (178) that is perpendicular or relatively perpendicular to the third lower wall (176), a third rear wall (180) that is parallel or relatively parallel to and spaced from the third front wall (178), a third proximal end wall (182), and a third distal end wall (184) that is parallel or substantially parallel to and spaced from the third proximal end wall (182). The third proximal end wall (182) and the third distal end wall (184) are perpendicular or substantially perpendicular to the third lower wall (176), the third front wall (178), and the third rear wall (180).

As best shown in FIGS. 3, 5, and 6, the upper wall of the third cover (174) includes a plurality of upper outlets (also referred to herein as upper outflow ports) (186). Each of the upper outlets (186) is aligned with and communicates with a corresponding one of the lower inlets (128) of the first enclosure unit (110) to provide inter-unit or inter-module passages. Although four upper outlets (186) are shown in FIGS. 3, 5, and 6, it should be understood that the third cover (174) may include fewer or more upper outlets (186). In an exemplary embodiment, the quantity of upper outlets (186) equals the quantity of the lower inlets (128).

The third front wall (178) includes inflow vent openings (190) and inflow vent slots (192) that are in communication with the third compartment for receiving a gas, such as air, through the inflow vent openings (190) and the inflow vent slots (192) and into the third compartment. Although not shown, the third compartment of the third enclosure unit (170) may include a baffle configured and arranged similarly to the baffle (164), discussed above, within the chamber of the third enclosure unit (170) to separate the inflow of gas, typically air, through the inflow vent openings (190) below the baffle and the inflow vent slots (192) above the baffle. The third rear wall (180) does not include vents or openings, although the presence of vents or openings in the third rear wall (180) is not prohibited unless so specified. Further, the inflow vent openings (190) and/or the inflow vent slots (192) may be provided on other walls of the third enclosure unit (170), in addition to or instead of in the third front wall (178).

Referring now more particularly to FIG. 5, an embodiment of a method of operation for removing heat byproducts of CPUs and other electronic components from the system (100), especially, the second and third enclosure units (140) and (170), respectively, will now be described. In FIG. 5, an arrow (200) represents gas, typically air, flowing into the second compartment of the second enclosure unit (140) through the inflow vent openings (160) and the inflow vent slots (162) in the second front wall (148). Likewise, an arrow (202) represents gas, typically air, flowing into the third compartment of the third enclosure unit (170) through the inflow vent openings (190) and the inflow vent slots (192) in the third front wall (178). The gas inflows (200) and (202) preferably are relatively cool gas, for example, having a temperature at or below ambient or room temperature. Optionally, one or more gas movers (or air movers), not shown, may be located in front of (or in proximity to) the system (100) for forcing the gas (e.g., air) flows (200) and (202) through the inflow vent openings (160) and (190) and the inflow vent slots (162) and (192).

Arrows (204) in FIG. 5 represent the continuation of gas (e.g., air) flow (200) from the second compartment of the second enclosure unit (140), through the lower outlets (156) of the second tray (142) and the aligned (interconnected) upper inlets (126) of the first cover (114) of the first enclosure unit (110), into the second, fourth, sixth, and eighth cells (132), (134), (136), and (138), respectively. Likewise, arrows (206) in FIG. 5 represent the continuation of gas, typically air, flow (202) from the third compartment of the third enclosure unit (170), through the upper outlets (186) of the third cover (174) and the aligned (interconnected) lower inlets (128) of the first tray (112) of the first enclosure unit (110), into the first, third, fifth, and seventh cells (131), (133), (135), and (137), respectively. The air flows (204) and (206) remove heat from the second compartment of the second enclosure unit (140) and the third compartment of the third stacked system (170), respectively. An arrow (208) in FIG. 5 represents the continuation of gas, typically air, flow from the plurality of cells (131)-(138), through the exhaust vent openings (130) in the first rear wall (120) of the first enclosure unit (110), into the atmosphere (or for recirculation, preferably after cooling via heat exchange), thereby expelling heat from the system (100).

Figure 9:
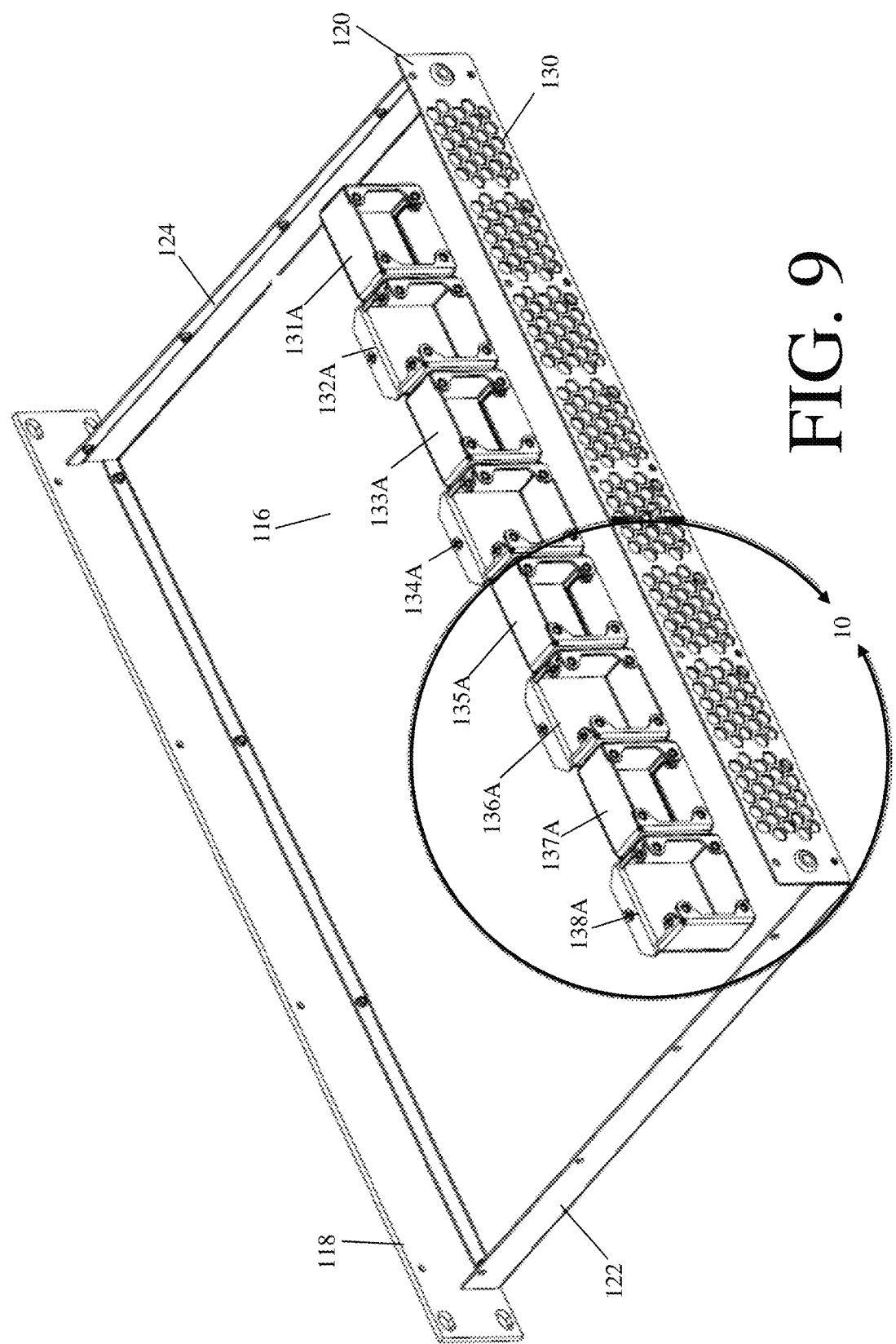
FIG. 9 depicts a lower tray of the middle enclosure unit of the system of FIG. 1 without the gas (e.g., air) movers shown.
Figure 10:
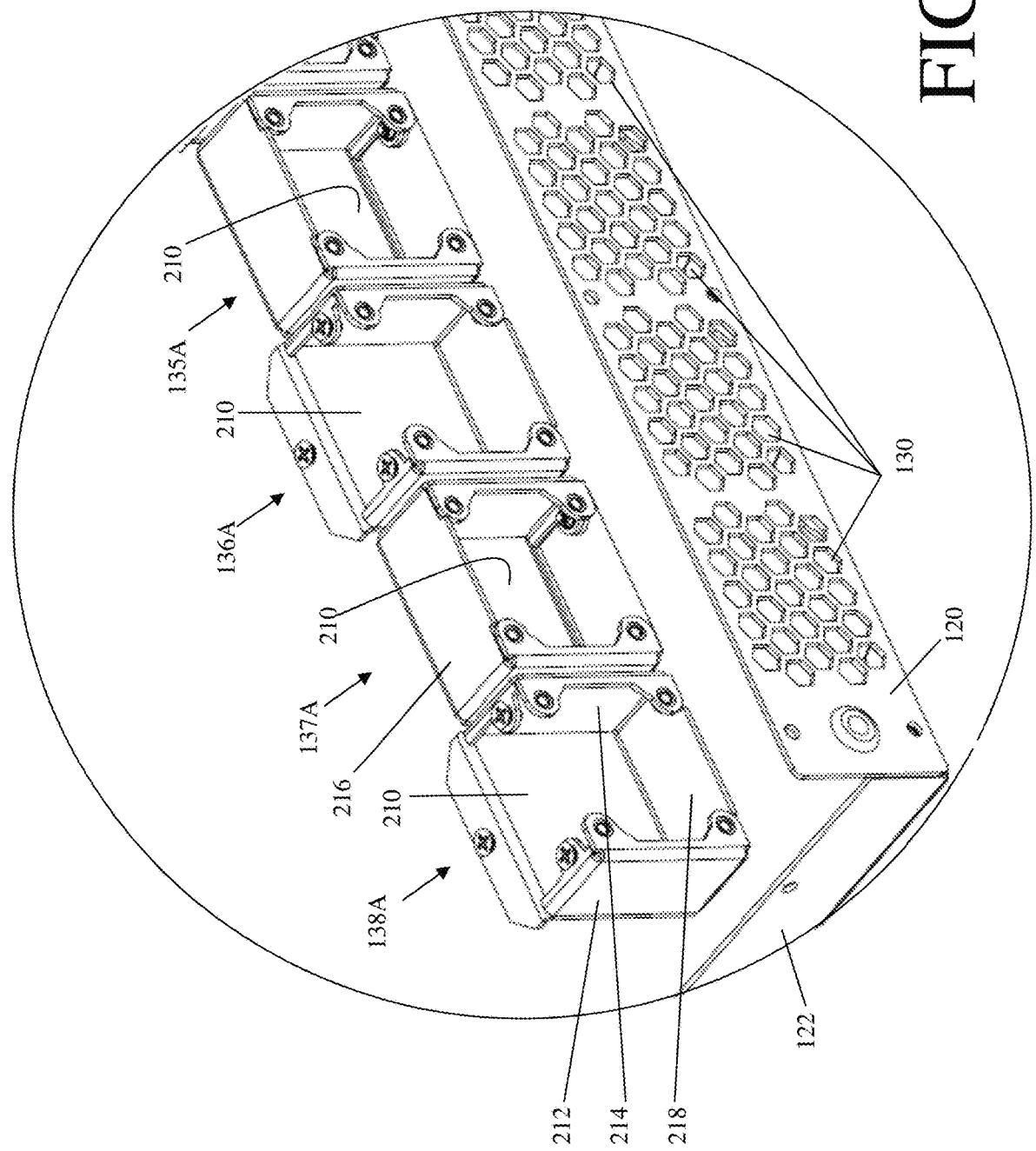
FIG. 10 depicts an enlarged view of the area enclosed by circle 10 of FIG. 9.

Referring now more particularly to FIGS. 7-10, the cells (131)-(138) are defined by flow guides (131A), (132A), (133A), (134A), (135A), (136A), (137A), and (138A), respectively. FIG. 9 illustrates the flow guides (131A)-(138A) with associated air movers (220) (discussed below) removed for explanatory purposes. The flow guides (131A)-(138A) each include a front wall (numbered (210) with respect to flow guides (135A)-(138A) in FIG. 10)) facing the first front wall (118), an open rear (unnumbered) positioned opposite to the front wall (210) and facing the first rear wall (120), opposite side walls (numbered (212) and (214) with respect to the flow guide (138A) in FIG. 10)), and either a top wall (numbered (216) with respect to the flow guide 137A in FIG. 10) or a bottom wall (numbered (218) with respect to the flow guide 138A in FIG. 10), one of which is sealed and the other of which is open. For example, in FIG. 9, the first, third, fifth, and seventh flow guides (131A), (133A), (135A), and (137A), respectively, have top walls (216) (FIG. 10) that are sealed and bottom walls (218) that are open to communicate with the aligned lower inlets (128) and upper outlets (186) to receive the gas flow (206). The second, fourth, sixth, and eighth flow guides (132A), (134A), (136A), and (138A), respectively, have bottom walls (218) (FIG. 10) that are sealed and top walls (216) that are open to communicate with the aligned upper inlets (126) and lower outlets (156) to receive the gas flow (204).

Each of the cells (131)-(138) is associated with a respective gas mover (also referred to herein as an air mover) (220). According to an embodiment best shown in FIG. 8, the gas movers (220) are attached, for example using screws or other mechanical fasteners, to the flow guides (131A)-(138A). In an exemplary embodiment, the gas movers (220) are electrically operated. In another exemplary embodiment, the gas movers (220) are operated by an alternative energy source, such as a solar panel. The gas movers (220) may be, for example, blowers, fans, impellers, etc.

According to an exemplary embodiment of operation, a first plurality of the gas movers (220) associated with the first, third, fifth, and seventh cells (131), (133), (135), and (137), respectively, receive or draw the gas flow (206) from the third compartment of the third enclosure unit (170), through the upper outlets (186) of the third cover (174) and the aligned lower inlets (128) of the first tray (112) of the first enclosure unit (110), through the first, third, fifth, and seventh flow guides (131A), (133A), (135A), and (137A), respectively. A second plurality of the gas movers associated with the second, fourth, sixth, and eighth cells (132), (134), (136), and (138), respectively, receive or draw the gas flow (204) from the second compartment of the second enclosure unit (140), through the lower outlets (156) of the second tray (142) and the aligned upper inlets (126) of the first cover (114) of the first enclosure unit (110), through the second, fourth, sixth, and eighth flow guides (132A), (134A), (136A), and (138A).

According to another embodiment, a gas mover (220) may be associated with a plurality of the cells (131), (132), (133), (134), (135), (136), (137), and/or (138). For example, in an embodiment a single gas mover can be associated with all of the cells (131)-(138) to expel gas from the cells (131)-(138) through the exhaust vents (130). According to another embodiment, a first gas mover is associated a first set of the cells (e.g., the first cell (131), the third cell (133), the fifth cell (135), and the seventh cell (137)) that receives the gas flow (206), while a second gas mover is associated with a second set of the cells (e.g., the second cell (132), the fourth cell (134), the sixth cell (136), and the eighth cell (138)) that receives the second gas flow (204).

Figure 11:
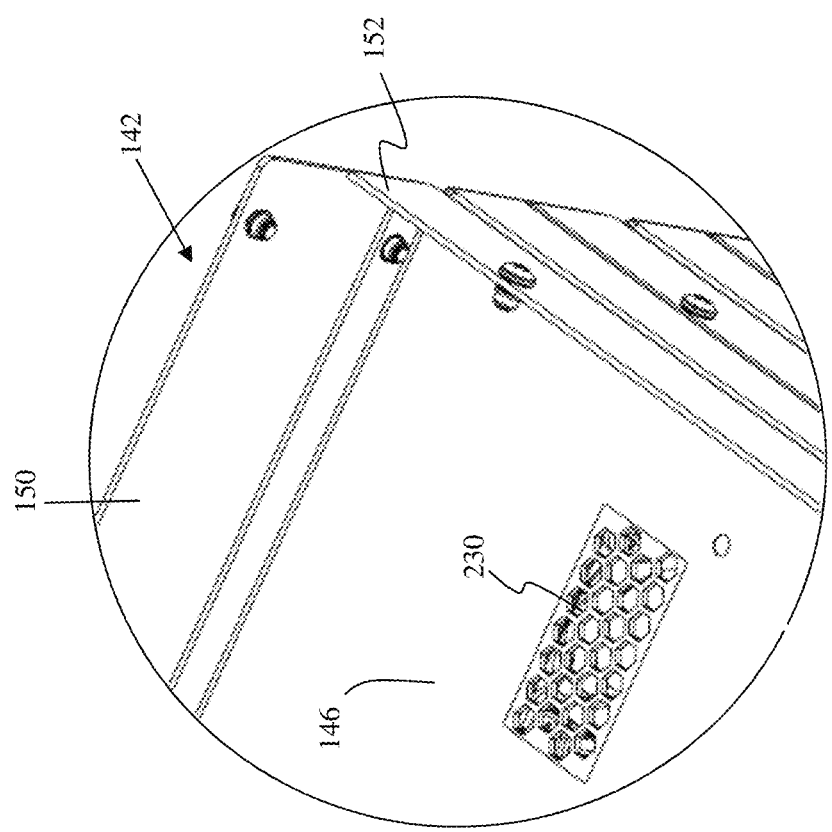
FIG. 11 depicts an enlarged view of the area enclosed by circle 11 of FIG. 2 according to another embodiment, with the area modified relative to FIG. 2 to include an electromagnetic interference (EMI) leakage reduction screen.

According to another embodiment, FIG. 11 depicts an enlarged view of the area enclosed by circle 11 of FIG. 2. The area enclosed within the circle 11 of FIG. 2 is modified in FIG. 11 to include an electromagnetic interference (EMI) leakage blockage member (230). In FIG. 11, the EMI leakage blocking member (230) is depicted as an EMI leakage blocking screen received at the lower outlet (156) of the second tray (142). Although only one EMI leakage blocking member (230) is shown in FIG. 11 at one of the lower outlets (156), it should be understood that additional EMI leakage blocking members (230), such as EMI leakage blocking screens, may be provided and proximally positioned relative to a plurality or all of the lower outlets (156) shown in FIG. 2. In another embodiment, one or more EMI leakage blocking members (230) may be provided at one, a plurality of, or all of the upper outlets (186) of the third cover (174). In another embodiment, one or more EMI leakage blocking members (230) may be provided at one, a plurality of, or all of the upper inlets (126) of the first cover (114) and/or one or more EMI leakage blocking members (230) may be provided at one, a plurality of, or all of the lower inlets (128) of the first tray (112). The EMI leakage blocking member (230) may be configured in other shapes. For example, the EMI leakage blocking members (230) may be configured as inserts positioned in one, a plurality of, or all of the flow guides (131A)-(138A). Any combination of EMI leakage blocking members described above may be implemented.

Figure 13:
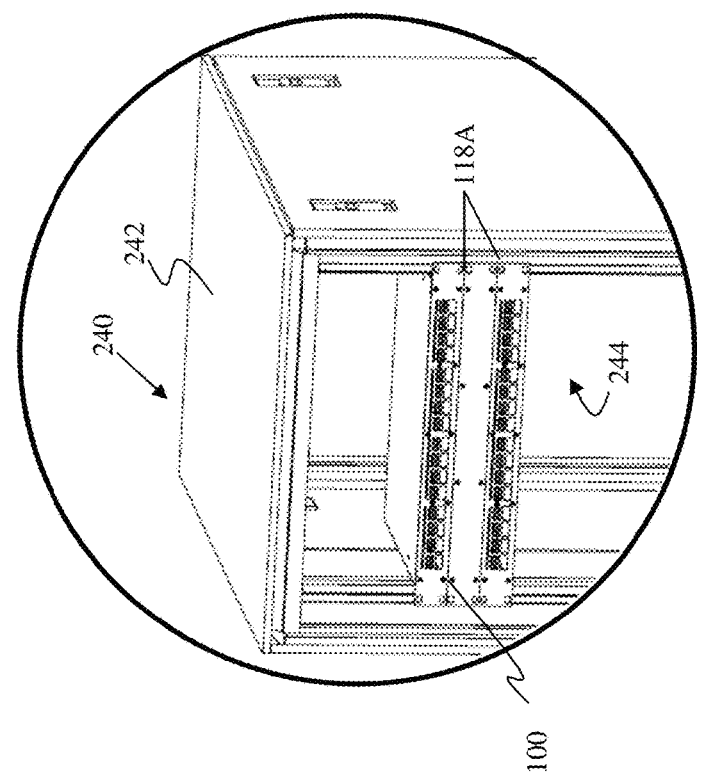
FIG. 13 depicts an enlarged view of the area enclosed by circle 13 in FIG. 12.
Figure 12:
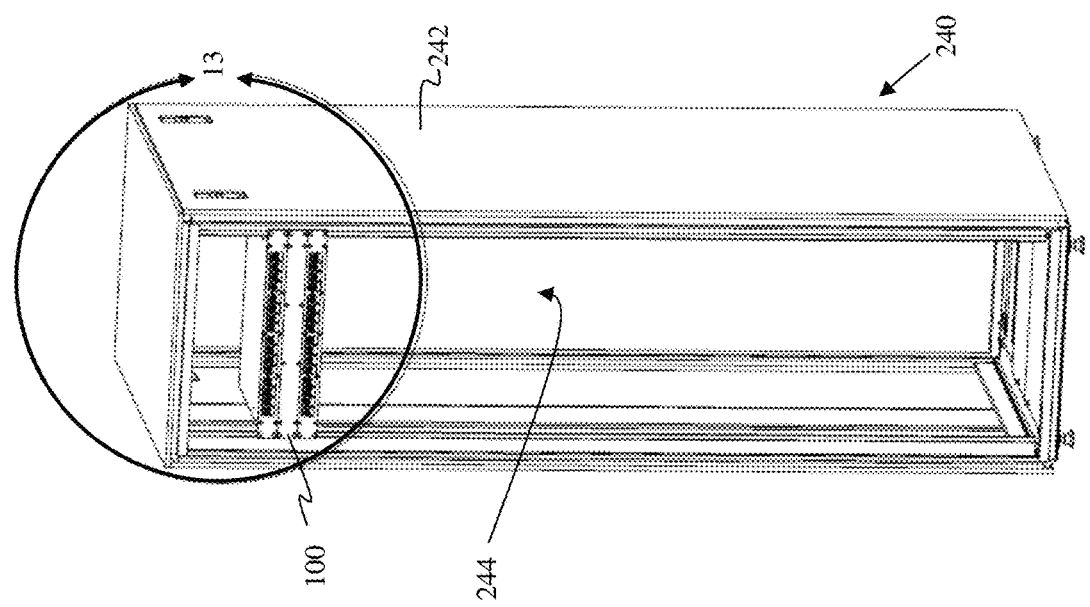
FIG. 12 is a side perspective view of an apparatus including the system of FIG. 1.

FIGS. 12 and 13 illustrate an apparatus (240) including the system (100) (including the first, second, and third enclosure units (110), (140), and (170), respectively), received in a bay or respective bays (244) of a rack (242), which may be configured as a cabinet (as shown) or framework. The bay(s) (244) may be partitioned from one another or open to one another without a partition. As best shown in FIG. 2, the first front wall (118A) of the first enclosure unit (110) includes four mounting holes (118A), the second front wall (148A) of the second enclosure unit (140) includes four mounting holes (148A), and the third front wall (178A) of the third enclosure unit (170) includes four mounting holes (178A). The mounting holes (118A), (148A), and (178) are sized and positioned for alignment with corresponding mounting holes in the rack (242) for receiving fasteners (e.g., screws, bolts, etc.) for removably securing the first, second, and third enclosure units (110), (140), and (170), respectively, of the system (100) to the rack (242). It should be understood that the mounting holes (118A), (148A), and (178A) may be provided with different configurations, positions, and quantities.

According to another embodiment, the first, second, and third enclosure units (110), (140), and (170), respectively, of the system (100) may be provided in a side-by-side adjacent relationship to one another in a rack or framework. Such configurations are sometimes referred to as blade servers.

Alternatively, the mounting holes (118A), and (148A), and (178A) may be omitted in their entirety, with the respective enclosure units (110), (140), and (170) stacked on one another or positioned adjacent (e.g., side-by-side) with respect to one another without a rack or framework.

Modification and variations of the above-discussed embodiments fall within the scope of the invention. Certain modifications and variations are discussed above. A non-exhaust discussion of others is set forth below with respect to the description of the embodiments of FIGS. 14 and 15.

Figure 14:
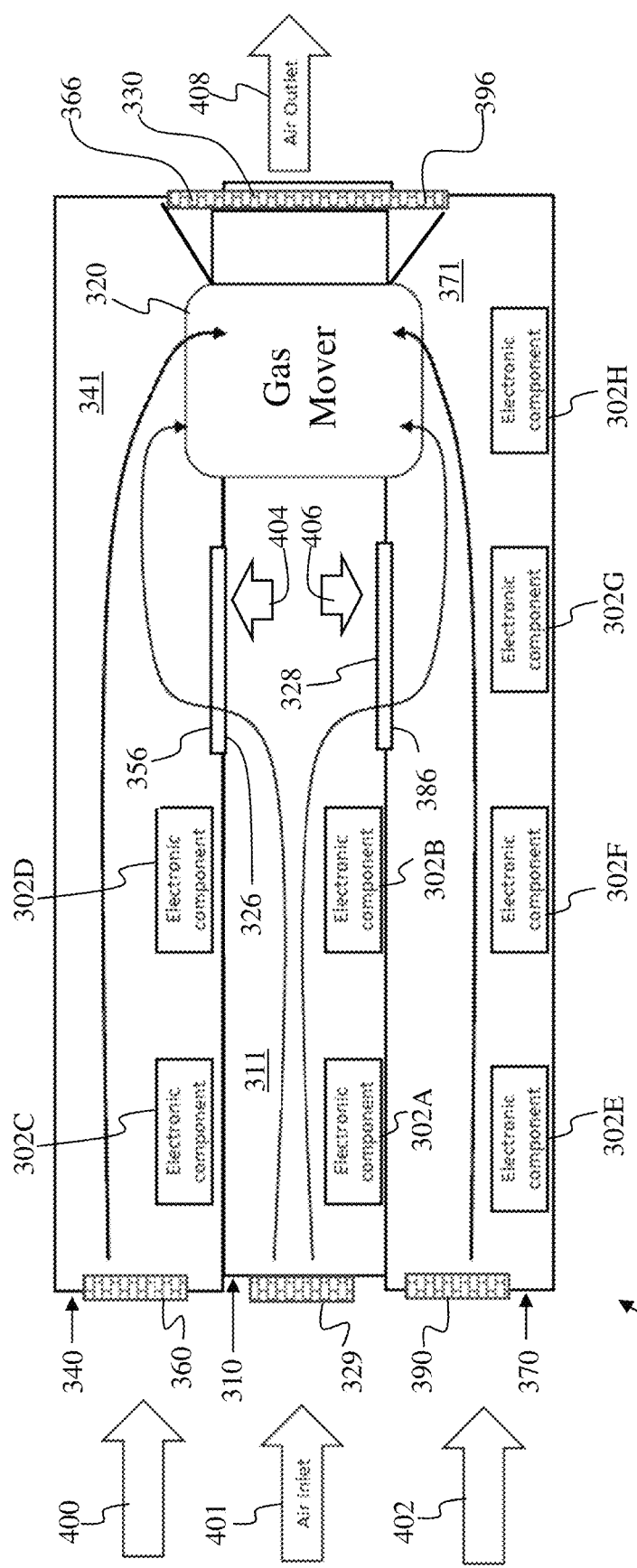
FIG. 14 is a block diagram of a system according to another embodiment.

Referring now more particularly to FIG. 14, a system according to another embodiment is generally represented by reference numeral (300). The system (300) includes a first enclosure unit (310), a second enclosure unit (340), and a third enclosure unit (370). The first enclosure unit (310) is positioned between the second enclosure unit (340) and the third enclosure unit (370). More specifically, the first enclosure unit (310) is stacked proximal to or on the third enclosure unit (370), and the second enclosure unit (340) is stacked proximal to or on the first enclosure unit (310). The first, second and third enclosure units (310), (340), and (370), respectively, may possess features, attributes, and interrelationships described above with respect to enclosure units (110), (140), and (170). For example, any or all of the enclosure units (310), (340), and (370) may each comprise a tray and a cover similar to those of enclosure units (110), (140), and (170), respectively.

The first enclosure unit (310) includes a first compartment or chamber (311), one or more inflow vent openings (329) communicating with the first compartment (311), and one or more outflow vent (or exhaust) openings (330). The second enclosure unit (340) includes a second compartment or chamber (341), one or more inflow vent openings (360) communicating with the second compartment (341), and one or more outflow vent (or exhaust) openings (366). The third enclosure unit (370) includes a third compartment or chamber (371), one or more inflow vent openings (390) in communication with the third compartment (371), and one or more outflow (or exhaust) vent openings (396).

The first, second, and third enclosure units (310), (340), and (370), respectively, are shown including hardware computing or electronic components (302A)-(302H) in their respective compartments (311), (341), and (371). In an embodiment, one or more of the first, second, and/or third enclosure units (310), (340), and/or (370), respectively, include a plurality of, for example, central processing units (CPUs) and system controllers (SCs), and/or slots receiving the same. Each CPU is associated with one or more CPU cores (or cores), such as a six-core processor or eight-core processor.

The system (300) of FIG. 14 includes at least one gas mover (320), which may be embodied as, for example, at least one blower, at least one fan, at least one impeller, etc. Although a single gas mover (320) is shown in FIG. 14, the system (300) may include a plurality of gas movers (320)

arranged, for example, in the manner described above with reference to FIGS. 1-13. The gas mover (320) is primarily located in the first compartment (311) of the first enclosure unit (310). The gas mover (320) extends upward into the second compartment (341) of the second enclosure unit (340) and downward into the third compartment (371) of the third enclosure unit (370). Gas flow imparted by the gas mover (320) through the system (300) in accordance with an embodiment is discussed below.

A top wall (unnumbered) of the first enclosure unit (310) includes an upper outlet (also referred to herein as an upper outflow port) (326). A bottom wall (unnumbered) of the first enclosure (310) includes a lower outlet (also referred to herein as a lower outflow port) (328). Although a single upper outlet (326) and a single lower outlet (328) are shown in FIG. 14, it should be understood that the first enclosure unit (310) may include additional upper outlets (326) than shown, and that the first enclosure unit (310) may include additional lower outlets (328). In an exemplary embodiment, the quantity of the upper outlets (326) equals the quantity of the lower outlets (328), although the quantities may differ. In an exemplary embodiment in which multiple upper outlets (326) and lower outlets (328) are present, the positioning of the upper outlets (326) is staggered with respect to the positioning of the lower outlets (328).

A bottom wall (unnumbered) of the second enclosure unit (340) includes a lower inlet (also referred to herein as a lower inflow port) (356). The lower inlet (356) is aligned with and communicates with the upper outlet (326) of the first enclosure unit (310) to provide an inter-unit or inter-module interconnected passage. Although one lower inlet (356) is shown in FIG. 14, it should be understood that the second enclosure unit (340) may include additional lower inlets (356). In an exemplary embodiment, the quantity of the lower inlets (356) equals the quantity of the upper outlets (326) of the first enclosure unit (310).

A top wall (unnumbered) of the third enclosure unit (370) includes an upper inlet (also referred to herein as an upper inflow port) (386). The upper inlet (386) is aligned with and communicates with the lower outlet (328) of the first enclosure unit (310) to provide an inter-unit or inter-module interconnected passage. Although a single upper inlet (386) is shown in FIG. 14, it should be understood that the third enclosure unit (370) may include additional upper inlets (386). In an exemplary embodiment, the quantity of the upper inlets (386) equals the quantity of the lower outlets (328) of the first enclosure unit (310).

An embodiment of a method of operation for removing heat byproducts of CPUs and other electronic components (302A)-(302H) from the system (300) will now be described. In FIG. 14, an arrow (400) represents gas flowing into the second compartment (341) of the second enclosure unit (340) through the inflow vent openings (360). Likewise, an arrow (401) represents gas flowing through the inflow vent openings (329) into the first compartment (311) of the first enclosure unit (310), and an arrow (402) represents gas flowing through the inflow vent openings (390) into the third compartment (371) of the third enclosure unit (370). The gas inflows (400), (401), and (402) preferably are relatively cool gas, for example air, having a temperature at or below ambient or room temperature. Optionally, one or more gas movers (or air movers), not shown, may be located in front of (or in proximity to) the system (300) for forcing the gas (e.g., air) flows (400), (401), and (402) through the inflow vent openings (360), (329), and (390), respectively.

The elongated curving arrows in FIG. 14 represent the continuation of gas (e.g., air) flows (400), (401), and (402). The gas flow (400) entering the second compartment (341) of the second enclosure unit (340) enters into an inlet (not shown) in the top of the gas mover (320). The gas flow (402) entering the third compartment (371) of the third enclosure unit (370) enters into an inlet (not shown) in the bottom of the gas mover (320). The gas flow (401) entering the first compartment (311) of the first enclosure unit (310) splits into gas flows (404) and (406). The gas flow (404) exits the first compartment (311) of the first enclosure unit (310) through the aligned upper outlet (326) and the lower inlet (356) into the second chamber (341) of the second enclosure unit (340), thereafter entering into the inlet in the top of the gas mover (320). The gas flow (406) exits the first compartment (311) of the first enclosure unit (310) through the aligned lower outlet (328) and the upper inlet (386) into the third chamber (371) of the third enclosure unit (370), thereafter entering into the inlet in the bottom of the gas mover (320). An arrow (408) represents the continuation of gas, typically air, flow discharged from the gas mover (320) through the exhaust vent openings (330), (366), and (396) into the atmosphere (or for recirculation, preferably after cooling via heat exchange), thereby expelling heat from the system (300).

Figure 15:
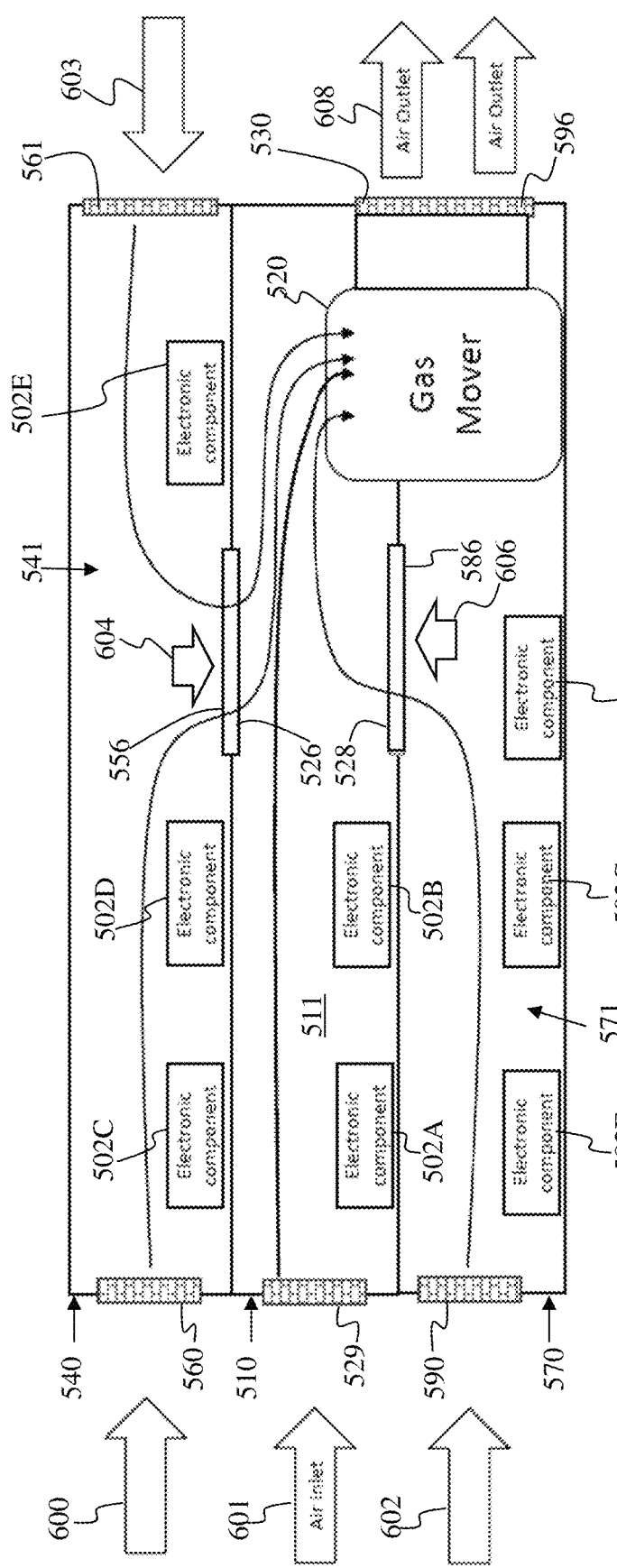
FIG. 15 is a block diagram of a system according to yet another embodiment.

Referring now more particularly to FIG. 15, a system according to another embodiment is generally represented by reference numeral (500). The system (500) includes a first enclosure unit (510), a second enclosure unit (540), and a third enclosure unit (570). The first enclosure unit (510) is positioned between the second enclosure unit (540) and the third enclosure unit (570). More specifically, the first enclosure unit (510) is stacked proximal to or on the third enclosure unit (570), and the second enclosure unit (540) is stacked proximal to or on the first enclosure unit (510). The first, second and third enclosure units (510), (540), and (570), respectively, may possess features, attributes, and interrelationships described above with respect to enclosure units (110), (140), and (170). For example, any or all of the enclosure units (510), (540), and (570) may each comprise a tray and a cover similar to those of enclosure units (110), (140), and (170), respectively.

The first enclosure unit (510) includes a first compartment or chamber (511), one or more inflow vent openings (529) communicating with the first compartment (511), and one or more outflow vent (or exhaust) openings (530). The second enclosure unit (540) includes a second compartment or chamber (541), and one or more front inflow vent openings (560) and one or more rear inflow openings (561) in communication with the second compartment (541). The third enclosure unit (570) includes a third compartment or chamber (571), one or more inflow vent openings (590) in communication with the third compartment, and one or more outflow vent (or exhaust) openings (596).

The first, second, and third enclosure units (510), (540), and (570), respectively, are shown including hardware computing or electronic components (502A)-(502H) in the compartments (511), (541), and (571), respectively. In an embodiment, one or more of the first, second, and/or third enclosure units (510), (540), and/or (570), respectively, include a plurality of, for example, central processing units (CPUs) and system controllers (SCs), and/or slots receiving the same. Each CPU is associated with one or more CPU cores (or cores), such as a six-core processor or eight-core processor.

The system (500) of FIG. 15 includes at least one gas mover (520), which may be embodied as, for example, one or more blowers, one or more fans, one or more impellers, etc. Although a single gas mover (520) is shown in FIG. 15, the system (500) may include additional gas movers (520) arranged, for example, in the manner described above with reference to FIGS. 1-13. The gas mover (520) is primarily located in the third compartment (571) of the third enclosure unit (570), and extends upward into the first compartment (511) of the first enclosure unit (510), but not into the second compartment (541) of the second enclosure unit (540). Gas flow imparted by the gas mover (520) in accordance with an embodiment is discussed below.

A top wall (unnumbered) of the first enclosure unit (510) includes an upper inlet (also referred to herein as an upper inflow port) (526). A bottom wall (unnumbered) of the first enclosure (510) includes a lower inlet (also referred to herein as a lower inflow port) (528). Although a single upper inlet (526) and a single lower inlet (528) are shown in FIG. 15, it should be understood that the first enclosure unit (510) may include additional upper inlets (526) and additional lower inlets (528). In an exemplary embodiment, the quantity of the upper inlets (526) equals the quantity of the lower inlets (528), although the quantities may differ. In an exemplary embodiment in which multiple upper inlets (526) and lower inlets (528) are provided, the positioning of the upper inlets (526) is staggered with respect to the positioning of the lower inlets (528).

A bottom wall (unnumbered) of the second enclosure unit (540) includes a lower outlet (also referred to herein as a lower outflow port) (556). The lower outlet (556) is aligned with and communicates with the upper inlet (526) of the first enclosure unit (510) to provide an inter-unit or inter-module interconnected passage. Although a single lower outlet (556) is shown in FIG. 15, it should be understood that the second enclosure unit (540) may include additional lower outlets (556). In an exemplary embodiment, the quantity of the lower outlets (556) equals the quantity of the upper inlets (526) of the first enclosure unit (510).

A top wall (unnumbered) of the third enclosure unit (570) includes an upper outlet (also referred to herein as an upper outflow port) (586). The upper outlet (586) is aligned with and is in communication with the lower inlet (528) of the first enclosure unit (510) to provide an inter-unit or inter-module interconnected passage. Although a single upper outlet (586) is shown in FIG. 15, it should be understood that the third enclosure unit (570) may include additional upper outlets (586). In an exemplary embodiment, the quantity of the upper outlets (586) equals the quantity of the lower inlets (528) of the first enclosure unit (510).

An embodiment of a method of operation for removing heat byproducts of CPUs and other electronic components (502A)-(502H) from the system (500) will now be described. In FIG. 15, arrows (600) and (603) represent gas flowing into the second compartment (541) of the second enclosure unit (540) through the inflow vent openings (560) and (561), respectively. Likewise, arrow (601) represents gas flowing through the inflow vent openings (529) into the first compartment (511) of the first enclosure unit (510), and arrow (602) represents gas flowing through the inflow vent openings (590) into the third compartment (571) of the third enclosure unit (570). The gas inflows (600), (601), (602), and (603) preferably are relatively cool gas, for example air, having a temperature at or below ambient or room temperature. Optionally, one or more gas movers (or air movers), not shown, may be located in front of and/or in back of (or in proximity to) the system (300) for forcing the gas (e.g., air) flows (600), (601), (602), and (603) through the inflow vent openings (560), (529), (590), and (561), respectively.

The elongated curving arrows in FIG. 15 represent the continuation of gas (e.g., air) flows (600), (601), (602), and (603). The gas flows (600) and (603) entering the second compartment (541) of the second enclosure unit (540) flow through the aligned lower outlet (556) and the upper inlet (526) into the first compartment (511) of the first enclosure unit (510), then into the top of the gas mover (520). The gas flow (601) entering into the first compartment (511) of the first enclosure unit (510) enters into the top of the gas mover (520). The gas flow (602) entering the third compartment (571) of the third enclosure unit (570) passes through the aligned lower inlet (528) and the upper outlet (586) into the first compartment (511) of the first enclosure unit (510), then into the top of the gas mover (520). An arrow (608) represents the continuation of gas, typically air, flow from the gas mover (520) through the outlet vent (or exhaust) openings (530) and (596) into the atmosphere (or for recirculation, preferably after cooling via heat exchange), thereby expelling heat from the system (500).

While particular embodiments have been shown and described, it will be understood to those skilled in the art, based upon the teachings herein, that changes and modifications may be made without departing from its broader aspects. Therefore, the appended claims are to encompass within their scope all such changes and modifications as are within the true spirit and scope of the embodiments. Furthermore, it is to be understood that the embodiments are solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to the embodiments containing only one such element, even when the same claim includes the introductory phrases "one or more" or "at least one" and articles such as "a" or "an"; the same holds true for the use in the claims of definite articles. As used herein, the term "and/or" means either or both (or any combination or all of the terms or expressed referred to).

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments were chosen and described in order to best explain the principles of the embodiments and the practical application, and to enable others of ordinary skill in the art to understand the embodiments for various embodiments with various modifications and combinations with one another as are suited to the particular use contemplated. Accordingly, the scope of protection of the embodiment(s) is limited only by the following claims and their equivalents.

What is claimed is:

1. A system comprising:
   a first enclosure unit comprising a first casing, the first casing comprising first and second walls spaced from one another and a first compartment within the first casing between the first and second walls, the first wall comprising a first inlet;

a second enclosure unit comprising a second casing that is stackable with respect to the first casing, the second casing comprising third and fourth walls spaced from one another and a second compartment within the second casing between the third and fourth walls, the third wall comprising a first outlet that, when the first and second casings are stacked with respect to one another with the first outlet and the first inlet aligned with one another, fluidly communicates the first and second compartments with one another;

at least one component operable to generate heat byproduct received in the first compartment of the first enclosure unit or the second compartment of the second enclosure unit; and one or more first gas movers at least partially received in the first compartment, the second compartment, or the first and second compartments, the one or more first gas movers being configured, when the first and second casing are stacked with respect to one another with the first outlet and the first inlet aligned, to receive gas through the aligned first inlet and first outlet and to expel the received gas through at least one exhaust vent of the system, wherein:
the one or more first gas movers are at least partially received in the first compartment;
the second wall of the first enclosure unit comprises a second inlet;
the first compartment further at least partially contains one or more second gas movers configured to receive gas from the second inlet and to expel the gas received from the second inlet through the exhaust vent; and
the system further comprises a third enclosure unit comprising a third casing stackable with respect to the first casing, the third casing comprising fifth and sixth walls spaced from one another and a third compartment within the third casing between the fifth and sixth walls, the third compartment configured to receive at least a second electronic component operable to generate heat byproduct, the fifth wall comprising a second outlet that, when the third casing is stacked with respect to the first casing with the second outlet and the second inlet aligned with one another, fluidly communicates with the second inlet to permit the one or more second gas movers to receive gas from the third compartment through the aligned second inlet and second outlet and to expel the received gas through the exhaust vent.

2. The system of claim 1, wherein the second enclosure unit and the third enclosure unit comprise a first electronics enclosure unit containing the first electronic component and a second electronics enclosure unit containing the second electronic component, respectively.

3. The system of claim 1, wherein the exhaust vent comprises at least one first exhaust vent associated with the one or more first gas movers and at least one second exhaust vent associated with the one or more second gas movers.

4. The system of claim 1, wherein the one or more first gas movers are different than the one or more second gas movers.

5. The system of claim 4, wherein:
the one or more first gas movers are configured to receive gas from the second compartment through the aligned first inlet and first outlet, but not from the third compartment through the aligned second inlet and second outlet, and to expel the gas received from the second compartment through the exhaust vent; and
the one or more second gas movers are configured to receive gas from the third compartment through the aligned second inlet and second outlet, but not from the second compartment through the aligned first inlet and first outlet, and to expel the gas received from the third compartment through the exhaust vent.

6. The system of claim 1, wherein:
the second casing comprises a first inflow vent configured to receive gas into the second compartment; and
the third casing comprises a second inflow vent configured to receive gas into the third compartment.

7. The system of claim 6, wherein the first and second inflow vents are provided in surfaces of the second and third casings, respectively, that are oppositely situated to a surface of the first casing in which the exhaust vent is provided.

8. The system of claim 1, wherein when the second and third casings are stacked above and below the first casing, respectively, the first wall is an upper wall of the first casing, the second wall is a lower wall of the first casing, the third wall is a lower wall of the second casing, and the fifth wall is an upper wall of the third casing.

9. The system of claim 1, wherein:
the first casing comprises a first tray and a first cover removably attachable to the first tray;
the second casing comprises a second tray and a second cover removably attachable to the second tray; and
the third casing comprises a third tray and a third cover removably attachable to the third tray.

10. The system of claim 9, wherein:
the first inlet and the second inlet are in the first cover and the first tray, respectively;
the first outlet is in the second tray; and
the second outlet is in the third cover.

11. The system of claim 1, wherein:
the first inlet comprises a plurality of first inlets in the first wall, each of the first inlets being associated with a corresponding first gas mover;
the second inlet comprises a plurality of second inlets in the second wall, each of the second inlets being associated with a corresponding second gas mover;
the first outlet comprises a plurality of first outlets in the third wall, each of the first outlets being configured to, when the second casing is stacked with respect to the first casing to align the first outlets with the first inlets, permit the first gas movers to collectively receive gas from the second compartment through the aligned first inlets and first outlets; and
the second outlet comprises a plurality of second outlets in the fifth wall, each of the second outlets being configured to, when the third casing is stacked with respect to the first casing to align the second outlets with the second inlets, permit the second gas movers to collectively receive gas from the third compartment through the aligned second inlets and second outlets.

12. The system of claim 11, wherein the aligned first inlets and first outlets are alternatingly arranged with respect to the aligned second inlets and second outlets.

13. The system of claim 11, wherein the first gas movers are alternatingly arranged with respect to the second gas movers.

14. The system of claim 11, wherein the first compartment of the first enclosure unit comprises a plurality of cells, the plurality of cells comprising:

a plurality of first cells each having a first closed end and an opposite first open end aligned with a corresponding one of the first inlets; and a plurality of second cells each having a second closed end and an opposite second open end aligned with a corresponding one of the second inlets.

15. The system of claim 14, wherein the first open ends open in opposite directions to the second open ends.

16. A system comprising:
a first enclosure unit comprising a first casing, the first casing comprising first and second walls spaced from one another and a first compartment within the first casing between the first and second walls, the first wall comprising a first inlet;
a second enclosure unit comprising a second casing that is stackable with respect to the first casing, the second casing comprising third and fourth walls spaced from one another and a second compartment within the second casing between the third and fourth walls, the third wall comprising a first outlet that, when the first and second casings are stacked with respect to one another with the first outlet and the first inlet aligned with one another, fluidly communicates the first and second compartments with one another;
at least one component operable to generate heat byproduct received in the first compartment of the first enclosure unit or the second compartment of the second enclosure unit; and
one or more first gas movers at least partially received in the first compartment, the second compartment, or the first and second compartments, the one or more first gas movers being configured, when the first and second casing are stacked with respect to one another with the first outlet and the first inlet aligned, to receive gas through the aligned first inlet and first outlet and to expel the received gas through at least one exhaust vent of the system,
wherein the one or more gas movers extend between and into the first compartment and the second compartment.

17. The system of claim 16, wherein:
the fourth wall of the second enclosure unit comprises a second outlet;
the system further comprises a third enclosure unit comprising a third casing stackable with respect to the second casing, the third casing comprising fifth and sixth walls spaced from one another and a third compartment within the third casing between the fifth and sixth walls, the third compartment configured to receive at least a second electronic component operable to generate heat byproduct, the fifth wall comprising a second inlet that, when the third casing is stacked with respect to the second casing with the second outlet and the second inlet aligned with one another, fluidly communicates with the second inlet to permit the one or more gas movers to receive gas from the second compartment through the aligned second inlet and second outlet and to expel the received gas through the exhaust vent; and
the one or more first gas movers extend between and into the first compartment, the second compartment, and the third compartment.

18. An apparatus, comprising:
a rack; and
a system receivable in the rack, the system comprising:
a first enclosure unit comprising a first casing, the first casing comprising first and second walls spaced from one another and a first compartment within the first casing between the first and second walls, the first wall comprising a first inlet;
a second enclosure unit comprising a second casing that is stacked with respect to the first casing, the second casing comprising third and fourth walls spaced from one another and a second compartment within the second casing between the third and fourth walls, the third wall comprising a first outlet that fluidly communicates the first and second compartments with one another;
at least a first electronic component operable to generate heat byproduct received in the first compartment of the first enclosure unit or the second compartment of the second enclosure unit; and
one or more first gas movers at least partially received in the first compartment, the second compartment, or the first and second compartments, the one or more first gas movers being configured to receive gas through the aligned first inlet and first outlet and to expel the received gas through at least one exhaust vent of the system
wherein:
the one or more first gas movers are at least partially received in the first compartment;
the second wall of the first enclosure unit comprises a second inlet;
the first compartment further at least partially contains one or more second gas movers configured to receive gas from the second inlet and to expel the gas received from the second inlet through the exhaust vent; and
the system further comprises a third enclosure unit comprising a third casing stackable with respect to the first casing, the third casing comprising fifth and sixth walls spaced from one another and a third compartment within the third casing between the fifth and sixth walls, the third compartment configured to receive at least a second electronic component operable to generate heat byproduct, the fifth wall comprising a second outlet that, when the third casing is stacked with respect to the first casing with the second outlet and the second inlet aligned with one another, fluidly communicates with the second inlet to permit the one or more second gas movers to receive gas from the third compartment through the aligned second inlet and second outlet and to expel the received gas through the exhaust vent.

19. A method comprising:
providing a system comprising:
a first enclosure unit comprising a first casing, the first casing comprising first and second walls spaced from one another and a first compartment within the first casing between the first and second walls, the first wall comprising a first inlet;
a second enclosure unit comprising a second casing that is stacked with respect to the first casing, the second casing comprising third and fourth walls spaced from one another and a second compartment within the second casing between the third and fourth walls, the third wall comprising a first outlet that fluidly communicates the first and second compartments with one another;
at least a first electronic component operable to generate heat byproduct received in the first compartment of the first enclosure unit or the second compartment of the second enclosure unit; and one or more first gas movers at least partially received in the first compartment, the second compartment, or the first and second compartments, the one or more first gas movers being configured to receive gas through the aligned first inlet and first outlet and to expel the received gas through at least one exhaust vent of the system; and operating the one or more first gas movers to receive gas from the second compartment through the fluidly communicating first outlet and first inlet and to expel the gas from the second compartment through the exhaust vent of the system wherein:

the one or more first gas movers are at least partially received in the first compartment;

the second wall of the first enclosure unit comprises a second inlet;

the first compartment further at least partially contains one or more second gas movers configured to receive gas from the second inlet and to expel the gas received from the second inlet through the exhaust vent; and the system further comprises a third enclosure unit comprising a third casing stackable with respect to the first casing, the third casing comprising fifth and sixth walls spaced from one another and a third compartment within the third casing between the fifth and sixth walls, the third compartment configured to receive at least a second electronic component operable to generate heat byproduct, the fifth wall comprising a second outlet that, when the third casing is stacked with respect to the first casing with the second outlet and the second inlet aligned with one another, fluidly communicates with the second inlet to permit the one or more second gas movers to receive gas from the third compartment through the aligned second inlet and second outlet and to expel the received gas through the exhaust vent.

20. An apparatus, comprising:

a rack; and a system receivable in the rack, the system comprising:

a first enclosure unit comprising a first casing, the first casing comprising first and second walls spaced from one another and a first compartment within the first casing between the first and second walls, the first wall comprising a first inlet;

a second enclosure unit comprising a second casing that is stacked with respect to the first casing, the second casing comprising third and fourth walls spaced from one another and a second compartment within the second casing between the third and fourth walls, the third wall comprising a first outlet that fluidly communicates the first and second compartments with one another;

at least a first electronic component operable to generate heat byproduct received in the first compartment of the first enclosure unit or the second compartment of the second enclosure unit; and one or more first gas movers at least partially received in the first compartment, the second compartment, or the first and second compartments, the one or more first gas movers being configured to receive gas through the aligned first inlet and first outlet and to expel the received gas through at least one exhaust vent of the system, wherein the one or more gas movers extend between and into the first compartment and the second compartment.

21. A method comprising:

providing a system comprising:

a first enclosure unit comprising a first casing, the first casing comprising first and second walls spaced from one another and a first compartment within the first casing between the first and second walls, the first wall comprising a first inlet;

a second enclosure unit comprising a second casing that is stackable with respect to the first casing, the second casing comprising third and fourth walls spaced from one another and a second compartment within the second casing between the third and fourth walls, the third wall comprising a first outlet that, when the first and second casings are stacked with respect to one another with the first outlet and the first inlet aligned with one another, fluidly communicates the first and second compartments with one another;

at least one component operable to generate heat byproduct received in the first compartment of the first enclosure unit or the second compartment of the second enclosure unit; and one or more first gas movers at least partially received in the first compartment, the second compartment, or the first and second compartments, the one or more first gas movers being configured, when the first and second casing are stacked with respect to one another with the first outlet and the first inlet aligned, to receive gas through the aligned first inlet and first outlet and to expel the received gas through at least one exhaust vent of the system, wherein the one or more gas movers extend between and into the first compartment and the second compartment; and operating the one or more first gas movers to receive gas from the second compartment through the fluidly communicating first outlet and first inlet and to expel the gas from the second compartment through the exhaust vent of the system.

\* \* \* \* \*